United States Patent
Doscher

(10) Patent No.: US 7,447,247 B1
(45) Date of Patent: Nov. 4, 2008

(54) SYSTEM AND METHOD FOR COMPENSATING FOR LASER NON-LINEARITY IN A LASER DRIVER SYSTEM

(75) Inventor: James C. Doscher, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 428 days.

(21) Appl. No.: 11/258,941

(22) Filed: Oct. 26, 2005

(51) Int. Cl.
*H01S 3/00* (2006.01)
(52) U.S. Cl. .................. 372/38.02; 372/38.1; 372/38.07
(58) Field of Classification Search ..... 372/38.1–38.02, 372/38.07
See application file for complete search history.

(56) References Cited

U.S. PATENT DOCUMENTS

| | | | | |
|---|---|---|---|---|
| 6,091,747 A | * | 7/2000 | Morita et al. | 372/38.02 |
| 6,414,974 B1 | | 7/2002 | Russell et al. | |
| 6,807,209 B2 | | 10/2004 | Martinez et al. | |
| 6,909,731 B2 | * | 6/2005 | Lu | 372/29.01 |
| 2004/0109482 A1 | * | 6/2004 | Nakayama | 372/38.02 |
| 2004/0165622 A1 | * | 8/2004 | Lu | 372/29.021 |
| 2004/0212390 A1 | * | 10/2004 | Harker | 324/765 |
| 2005/0008050 A1 | * | 1/2005 | Fischer et al. | 372/38.1 |
| 2006/0110169 A1 | * | 5/2006 | Reintjes et al. | 398/195 |

OTHER PUBLICATIONS

"Dual-Loop 50 Mbps-2.7 Gbps Laser Diode Driver," ADN2841, Analog Devices, Inc., 2002, p. 1-12.
"3.3 V Dual_Loop, 50 Mbps to 3.3 Gbps Laser Diode Driver," ADN2870, Analog Devices, Inc., 2004, p. 1-20.

* cited by examiner

*Primary Examiner*—Minsun Harvey
*Assistant Examiner*—Phillip Nguyen
(74) *Attorney, Agent, or Firm*—Gauthier & Connors LLP

(57) ABSTRACT

A laser driver system is disclosed that includes a first monitor current output node, a power set node, and a first feedback path. The first monitor current output node provides a first monitor current output signal that is representative of one of a bias current and a modulation current of the laser driver system. The power set node receives a power ratio set signal that represents a desired relationship of a power required for the laser driver to produce a high power level threshold to a power required for the laser driver to produce a low power level threshold. The first feedback path extends from the first monitor current output node to the power set node, and may be used for adjusting the power set signal when the monitor current output signal becomes non-linear.

30 Claims, 6 Drawing Sheets

SYSTEM AND METHOD FOR COMPENSATING FOR LASER NON-LINEARITY IN A LASER DRIVER SYSTEM

BACKGROUND OF THE INVENTION

The invention relates to laser driver systems, and relates in particular to laser driver systems that control average power and extinction ratio, or optical modulation amplitude.

Laser drivers are electronic circuits that provide a current that is used to power a laser, i.e., to cause it to emit light. The current source may be modulated (e.g., switched between two levels) to provide modulated information such as serial digital data. Additional current sources may be used to provide current for the purpose of controlling the average optical power of the laser. For example, the laser may be operated such that a digital zero is provided at a first optical output power level that is just above the lasing threshold of the laser. The laser may also be operated such that a digital one is provided at a second optical output power level that is above a higher threshold. Laser drivers facilitate the driving of such lasers (e.g., laser diodes) for purposes of data transmission, for example in a communication system, a printer, or a laser drilling system.

Laser Driver IC's are also used to control the average output power of the laser. The average power is the effective power with the laser switching on and off (high and low) at, for example, a 50% duty cycle. Average laser power is often calculated by adding the laser power for an optical one (called the $P_1$ level) to the power level for an optical zero (called the $P_0$ level), and multiplying the sum by the duty cycle. Typically, average power of the laser is measured by using a photodiode placed close to the back facet of the laser. The frequency response of the photodiode is much lower than the modulation rate of the laser. Being slower than the modulation rate, it averages the signal to provide the average power level and thus it appears as a DC signal.

For example, FIG. 1 shows a prior art laser driver that includes an output laser diode 10 that provides a laser output signal 12 as well as optical feedback 14 to a back-facet photo monitor diode 16. The photo monitor diode 16 is coupled to Vcc as shown and to an automatic power control loop (APC) 18. The APC 18 measures the current from the diode and compares it to the average power ($P_{AV}$) set point signal 22. If there is a delta between those points, the APC 18 changes the bias current at the bias current source 20, which changes the draw of current through the laser diode 10. The APC tells the current source to increase or decrease. The current monitor is a signal 24 that indicates the amount of current in the current source. The bias current source 20, therefore, ensures that the laser is operating above its low threshold point, i.e., that there is always some amount of current flowing in the laser. The laser should have at least the minimum amount of current through it that it produces light: this is the $P_0$ point. The bias current source also provides a bias current monitor signal 24 that is indicative of the current in the bias current source 20. Note that in the absence of a modulation current signal the bias current will rise until the laser matches the average power represented by the set-point. When a modulation current ($I_{mod}$) is present, the bias current ($I_{bias}$) will decrease to account for the average power made by the modulation current. The bias current may decrease until it matches the threshold current, or $P_0$ values of the laser.

The laser value of the modulation current will control the difference between the $P_1$ and $P_0$ level. The optical power is typically measure two ways. The first is called Optical Modulation Amplitude (OMA) and it simply $P_1$-$P_0$ and is typically measured in Watts of light energy. The second is know as Extinction Ratio (ER) defined as 10 LOG($P_1/P_0$) and is in units of dB. While there are two ways to measure this, the result is the same. It is a measurement of the difference between an optical one and an optical zero.

The circuit of FIG. 1 also includes a modulation current source 26 that receives a modulation current set point signal 28, and is coupled to the laser diode 10 via a data switch 30. The modulation current source 26 ensures that when a digital one is needed, there is sufficient current flowing through the laser to produce an optical one. The modulation current source 26 also provides a modulation current monitor signal 32 that is indicative of the level of current in the modulation current source 26. When the data switch 30 is turned on (responsive to a data signal 34), the modulation current source will supply the appropriate amount of current through the diode 10 to product an optical one. The components may be mounted on a single integrated circuit chip 36 as shown.

The Laser Driver is designed to provide the bias and modulation currents required to maintain a steady average power and extinction ratio (ER) over changes in temperature and time. There are two complications, first the characteristics of the laser change dramatically over temperature and second, ER is very difficult to measure.

The output power for the $P_1$ level may be set by measuring the optical output of the laser with a measurement instrument, and then adjusting the modulation current until the correct P1 level is achieved. The efficiency of the laser in mA per Watt (known as the LI), is a measure of how much current is required to produce a particular power level. The laser efficiency changes with temperature and causes the LI to decrease with temperature. Thus as the temperature increases and the LI decreases, the laser will produce less power and the $P_1$ level will not be maintained. The ER for a laser driver and laser combination are typically calibrated by using an external measurement of optical amplitude by an instrument. Additional control systems may be added to increase the modulation current as the temperature increases in order to maintain a constant ER or OMA over temperature. This may be a desirable feature for an optical communications system.

Laser efficiency is expressed as the amount of current required to produce a given output optical power. The ER is difficult to measure because the threshold current at which point the laser begins to emit light varies with temperature. As the efficiencies and threshold change over temperature, the level of modulation current must also be adjusted over temperature if the ER and average power are to be maintained. Certain conventional laser drivers employ look-up tables for different temperatures. A look-up table is compiled for each laser driver based on tests that are run over a range of temperatures. The use of the look-up table facilitates compensating for large temperature variations that occur in the efficiency of the laser over temperature. As each laser diode ages, however, the performance may change. If the look-up tables are not recalibrated, the performance of the system may be compromised. This approach is expensive as it may require calibration of each laser over temperature in order to achieve high accuracy.

It is possible to attempt to measure the LI curve of the laser over temperature, but it is difficult. There is no easy way to measure the optical power to produce a single one bit or a single zero bit as the modulation and switching occurs too quickly: such a measurement system might have to work in the gigahertz range. Many conventional laser drivers perform an average power measurement using a monitor photodiode. The monitor photodiode may receive a small amount of light that escapes from a non-output surface of the resonant cavity of the laser. If the bandwidth of the photodiode is very low, the photodiode averages the laser output very quickly and provides a measurement of average power, not of the peak power. Since ER is the ratio $(P_1-P_0)/P_0$ and average power is $(P_1-P_0)/2$, there are three variable and two unknowns. It is not possible, therefore, to determine either the $P_1$ or $P_0$ level with simply a measure of average power.

Despite the difficulty outlined above, certain conventional laser control systems employ dual loop control as disclosed, for example in U.S. Pat. No. 6,414,974, which permits the measurement of the efficiency of the laser in real time. Such systems may continuously send a small low frequency test pulse that is represented as a small change in power. The systems change the power a small amount that is not enough to disturb the digital signal data. A small fraction of the power is received through a back end facet of the laser diode by a photodiode, and the monitoring of this power permits the extinction ratio to be controlled since the efficiency of the laser (the LI curve) is constantly monitored. Knowing the efficiency of the laser, permits the laser driver to better control the laser efficiency over a range of temperatures.

FIG. 2 shows another prior art laser driver on an integrated circuit chip 38 that includes an output laser diode 40 that provides a laser output signal 42 as well as optical feedback 44 to a back-facet photo monitor diode 46. The photo monitor diode 46 is coupled to Vcc as shown and to an automatic power control loop (APC) 48. The APC 48 measures the current from the diode and compares it to the average power set point signal 52. If there is a delta between those points, the APC 48 changes the bias current at the bias current source 50, which changes the draw of current through the laser diode 40. The system also includes a bias current monitor signal 54 that is indicative of the amount of current in the current source 50 as discussed above.

The circuit of FIG. 2 also includes a laser LI measurement and control unit 56 that receives an optical modulation amplitude (OMA) extinction ratio set point signal 58, and is coupled to and controls a modulation current source 60. The modulation current source 60 is coupled to the laser diode 40 via a data switch 62. The laser LI measurement and control unit also controls an LI measurement test current signal source 64 that is coupled to the laser diode 40, as well as an APC signal from the APC 48. The modulation current source 60 also provides a modulation current monitor signal 66 that is indicative of the level of current in the modulation current source 60. When the data switch 62 is turned on (responsive to a data signal 68), the modulation current source will sink the appropriate amount of current through the diode 40 to product an optical one. These circuits may include either direct connections, or an AC coupled connections where there are capacitors between the laser and the other elements.

The system of FIG. 2 estimates the LI curve and automatically control the value of the modulation current. The automatic power control loop is essentially the same as in the system of FIG. 1. The laser measurement and control block receives the set point as an input. The input, however, is a desired extinction ratio instead of a modulation value. Instead of setting a current therefore, a measure of performance of the laser is being set. The system of FIG. 2 includes a test current source (the LI measurement test current) that is a small current that is drawn from the laser that is controlled by the measurement block. At various times, the LI measurement control block looks at what the automatic power control loop is seeing. When small test currents in are introduced into the system, it is expected that a small change in the average power will result. The laser measurement control unit also has a control signal that is provided to the modulation current source.

Such a system has the advantage of only requiring calibration of the average power and ER at one temperature, and then the system is able to control these parameters over temperature by constantly measuring efficiency changes in the laser. The accuracy of the system is set by how accurately the LI curve may be measured. Existing implementations make an assumption that the laser LI curve is linear over the desired range of operation, i.e., that each additional mA of current added to the laser will result in the same additional increase in laser optical power. Various schemes may also accommodate a simple non-linear component such as a first order non-linearity. For more complex non-linearities, the system fails as it is unable to make an accurate measurement of the laser LI curve, and as a result the ER varies from the desired result. Laser non-linearity tends to occur at high temperatures or at high current levels. Laser efficiency decreases as temperatures and currents increase until the point that further increases in current no longer result in an increase in output power.

Further prior art devices or methods provide that the extinction ratio may be controlled or stabilized using the modulation and bias currents. For example, U.S. Pat. No. 6,807,209 discloses a system for controlling the extinction ratio for an optical transmitter wherein a measurement the bias current used to determine a value for the modulation current in order to control the extinction ratio. This U.S. Pat. No. 6,807,209 discloses that the laser's performance may be improved as temperature increases. Such a system is a method for controlling extinction ratio however, and it does not try to correct for non-linearity.

There is a need, therefore, for a more efficient and economical system for providing linear output power in a laser driver over a wide range of temperatures.

SUMMARY OF THE INVENTION

The invention provides a laser driver system that includes a first monitor current output node, a power set node, and a first feedback path in accordance with an embodiment. The first monitor current output node provides a first monitor current output signal that is representative of one of a bias current and a modulation current of the laser driver system. The power set node receives a power set signal that represents a desired relationship of a power required for the laser driver to produce a high power level threshold to a power required for the laser driver to produce a low power level threshold. The first feedback path extends from the first monitor current output node to the power set node, and may be used for adjusting the power set signal when the monitor current output signal becomes non-linear.

In various further embodiments, the first monitor current output node may be either a modulation current monitor node or a bias current monitor node, and the power set signal may be either an extinction ratio or an optical modulation amplitude signal. In accordance with a further embodiment, the laser drive may include a second feedback path extending from a second monitor current output node to the power set node for adjusting the power set signal when the second monitor current output signal becomes non-linear.

In accordance with a further embodiment, the system provides a laser driver system that includes a bias current output node, a monitor current output node, a power set node, and a first feedback loop. The bias current output node provides a bias current monitor current output signal that is representative of a bias current of the laser driver system. The monitor current output node provides a monitor current output signal that is representative of a monitor current of the laser driver system. The power set node receives a power set signal that represents a desired relationship of a power required for the laser driver to produce a high power level threshold to a power required for the laser driver to produce a low power level threshold. The first feedback path extends from the bias monitor current output node to the power set node for adjusting the power set signal when the bias monitor current output signal becomes non-linear. The second feedback path extends from the current monitor output node to the power set node for adjusting the power set signal when the monitor current output signal becomes non-linear.

In accordance with a further embodiment, the invention provides a method of controlling a laser driver system. The method includes the steps of providing a first monitor current output signal that is representative of one of a bias current and a modulation current of the laser driver system, receiving a power set signal that represents a desired relationship of a power required for the laser driver to produce a high power level threshold to a power required for the laser driver to produce a low power level threshold, providing a feedback path extending from the first monitor current output node to the power ratio set node, and adjusting the power ratio set signal when the first monitor current output signal becomes non-linear responsive to the feedback path.

BRIEF DESCRIPTION OF THE DRAWING

The following description may be further understood with reference to the accompanying drawing in which.

The drawings are shown for illustrative purposes.

DETAILED DESCRIPTION OF THE ILLUSTRATED EMBODIMENTS

In certain laser driver systems, when a laser is operated at high temperatures or at very high modulation currents, the laser LI curve may become non-linear. The increased laser non-linearity may cause the laser driver to incorrectly measure the LI curve and hence then fail to control the laser to the correct ER or OMA. For example, if it measures the LI to be lower than actual, the control loop of the chip overcompensates and increase the modulation current causing the ER to increase incorrectly.

Applicant has discovered that there is a high correlation between increases in modulation and bias current and the actual non-linearity present in the laser. Laser non-linearity, therefore, may be detected by monitoring changes in the bias and modulation currents. For example non-linear increases in the modulation current as temperature increase actually provides an indication that the laser is operating in its less linear region. The errors in extinction ratio can be corrected by measuring $I_{bias}$ or $I_{mod}$ and feeding these signals back to the set-point control to cancel the effects of nonlinearity. An advantage is that since the bias and modulation current measure the performance of the laser in situ and are a measure of the non-linearity of that particular laser, the method uniquely corrects for the non-linearity of each individual laser as opposed to simply applying a pre-determined correction to all lasers.

An implementation of such a non-linearity correction system in a laser control system may, for example, provide a feedback loop from the modulation current monitor output (IMMON) via an impedance to the extinction ratio (ER) set input of the laser control system. The system relies on the assumption that when the bias or modulation current becomes non-linear, the laser's efficiency is assumed to be decreasing in a non-linear fashion as well and the laser driver is likely to make an error in controlling the laser. The $I_{bias}$ and $I_{mod}$ monitors may be used to measure this nonlinearity in a feedback network to reduce the ER input setpoint to cancel the effect of the nonlinear laser. This is achieved in an embodiment, by providing a feedback path from the IMMON node output to the ER set node via a resistor divider network. In further embodiments, the bias current monitor (IBMON) node output may also be used either in place of, or together with, the IMMON node output. For laser driver systems employing a microcontroller, the system may measure the modulation current using an analog-to-digital converter, and then use a calculation to determine a fraction of this current that is used to decrease the extinction ratio set point.

Figure 1:
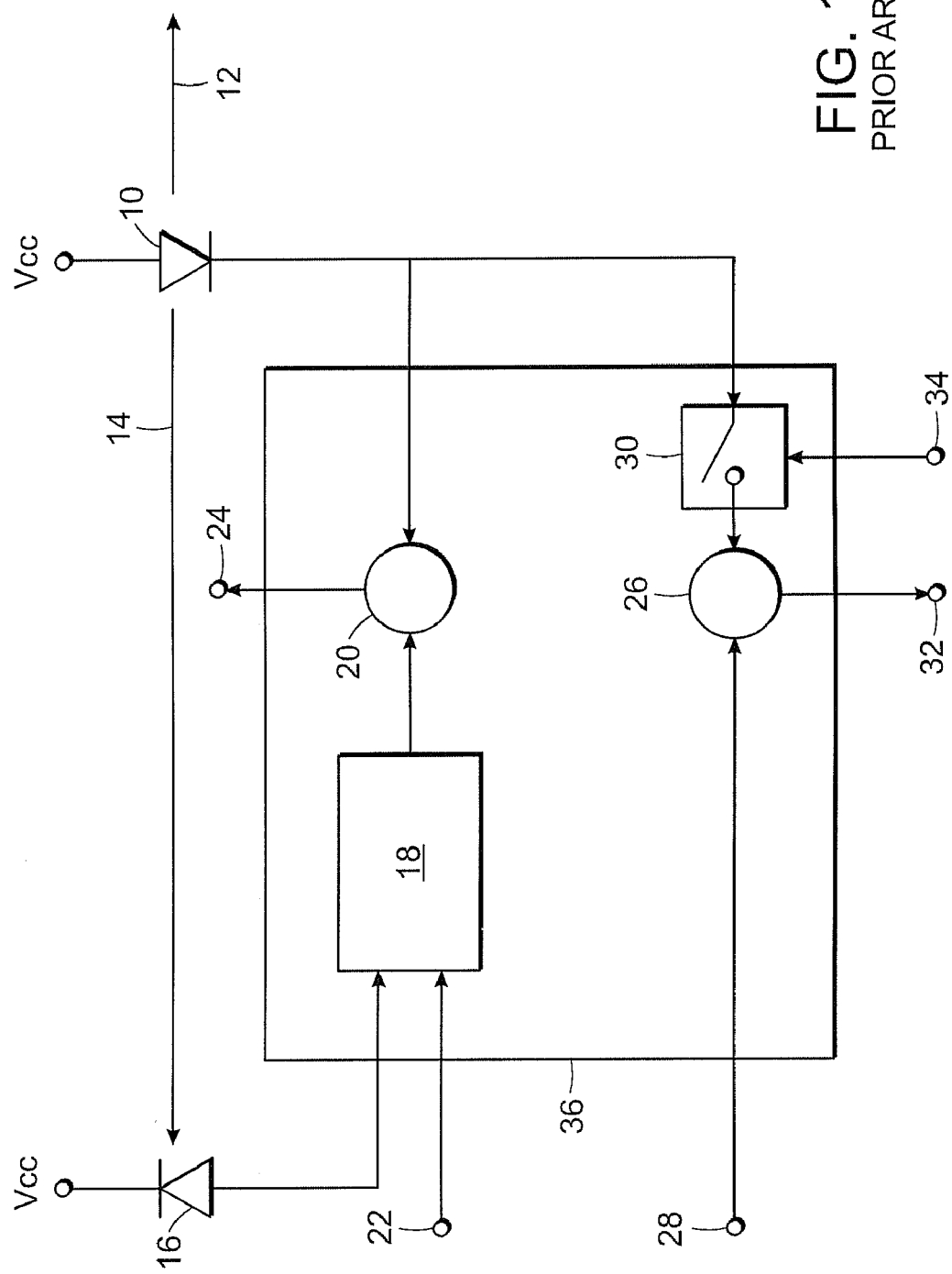
FIGS. 1 and 2 show illustrative diagrammatic views of laser driver system in accordance with the prior art.
Figure 2:
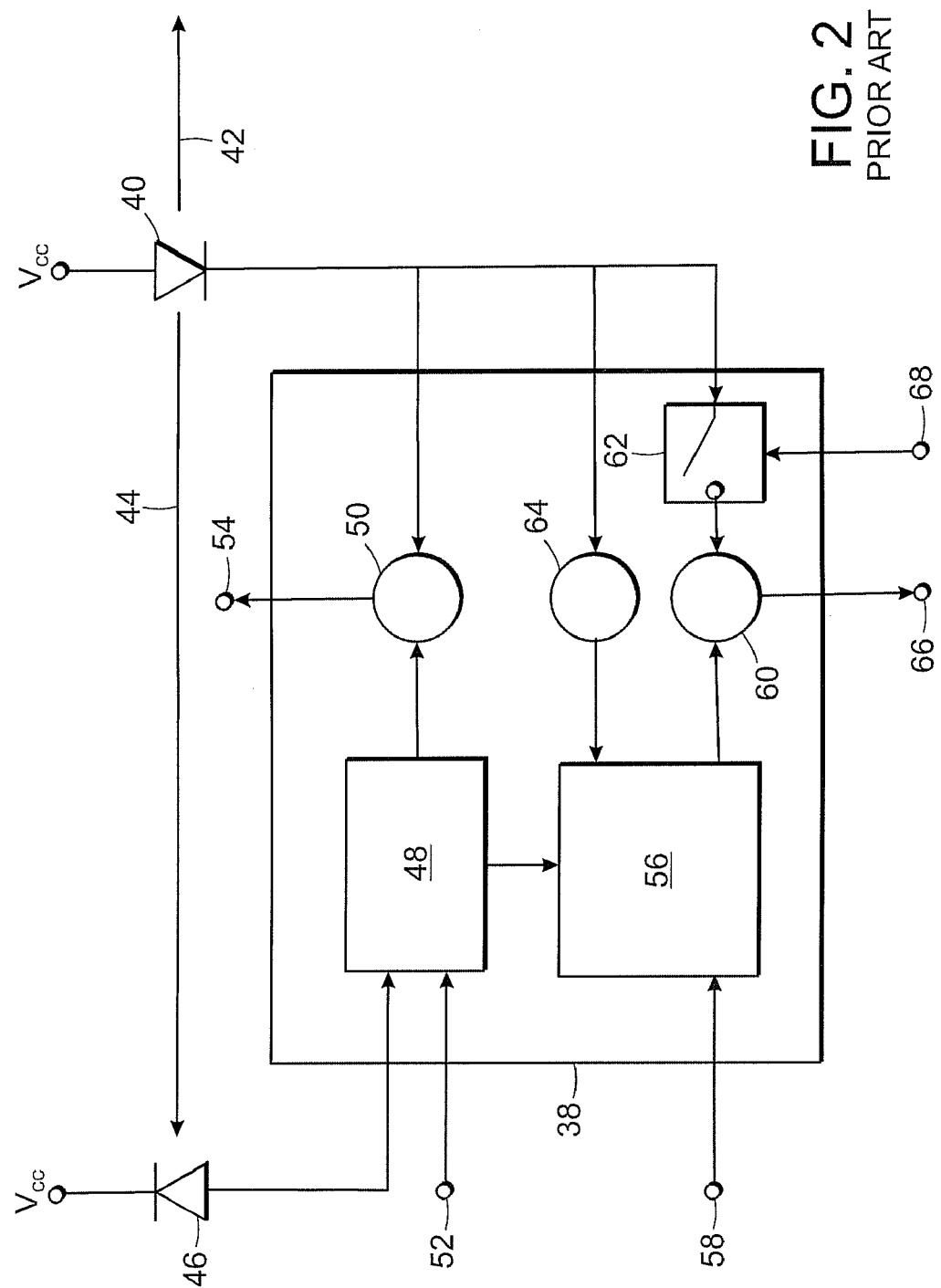
Figure 3:
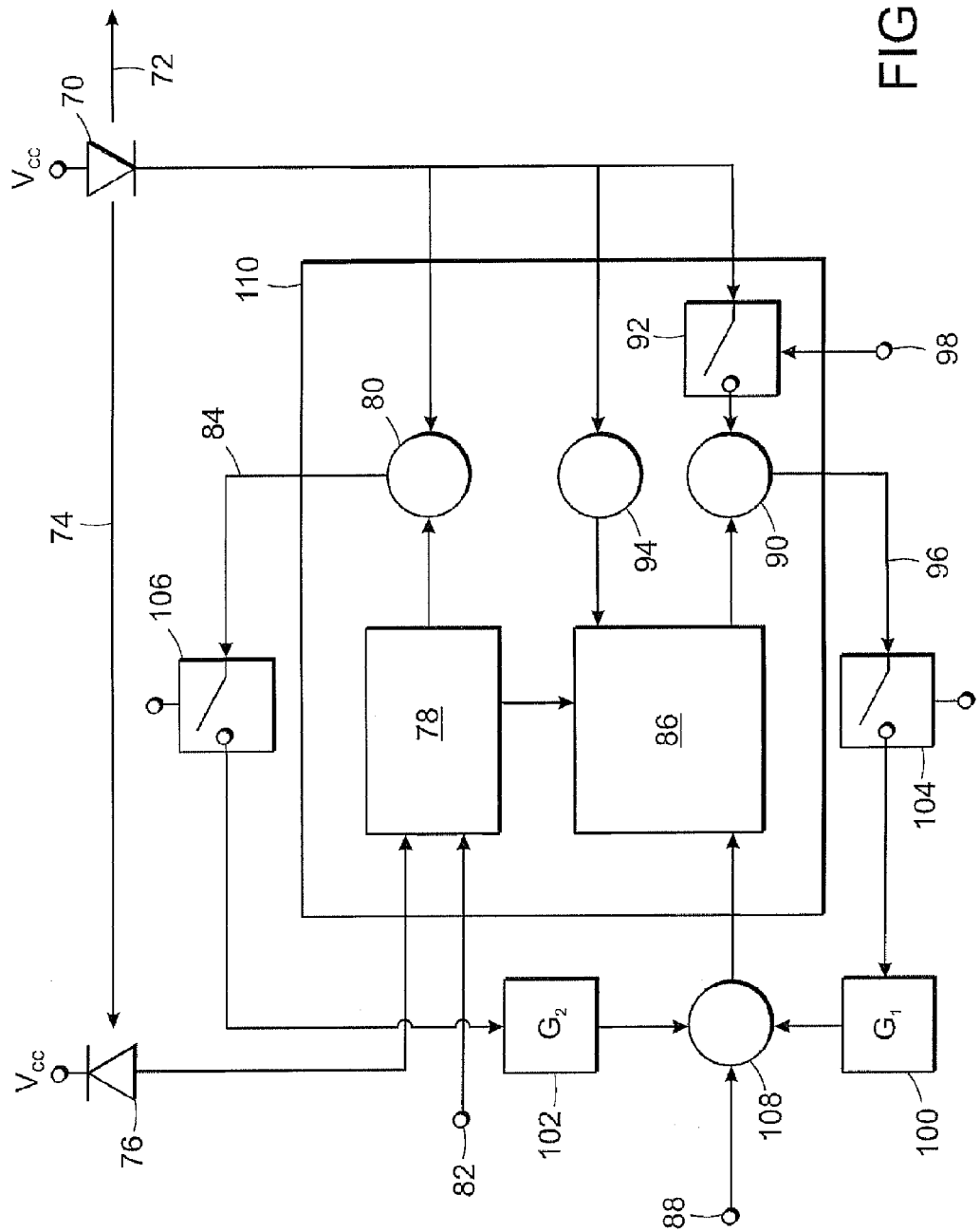
FIG. 3 shows an illustrative diagrammatic view of a laser driver system in accordance with an embodiment of the invention.

For example, FIG. 3 shows a dual loop laser driver system in accordance with an embodiment of the invention that provides APC and OMA control and includes feedback to reduce ER error due to non-linearity. The system includes an output laser diode 70 that provides a laser output signal 72 as well as optical feedback 74 to a back-facet photo monitor diode 76. The photo monitor diode 76 is coupled to Vcc as shown and to an automatic power control loop (APC) 78. The APC 78 measures the current from the diode and compares it to the set point signal 82 (the average power set point). If there is a delta between those points, the APC 78 changes the bias current at the bias current source 80, which changes the draw of current through the laser diode 70. The system also includes a bias current monitor signal 84 that is indicative of the amount of current in the current source 80 as discussed above.

The circuit of FIG. 3 also includes a laser LI measurement and control unit 86 that receives an OMA/ER set point signal 88, and is coupled to a modulation current source 90. The modulation current source 90 is coupled to the laser diode 70 via a data switch 92. The laser LI measurement and control unit also controls an LI measurement test current signal from an LI measurement test current source 94 that is coupled to the laser diode 70, as well as a APC signal from the APC 78. The modulation current source 90 also provides a modulation current monitor signal 96 that is indicative of the level of current in the modulation current source 90. When the data switch 92 is turned on (responsive to a data signal 98), the modulation current source will sink the appropriate amount of current through the diode 70 to product an optical one. These circuits may include either direct connections, or an AC coupled connections where there are capacitors between the laser and the other elements.

The system of FIG. 3, estimates the LI curve and automatically control the value of the modulation current. The laser measurement and control block receives the extinction ratio set point as an input. The system of FIG. 3 also includes a test current source (the LI measurement test current) that is a small current that gets pulled from the laser and is controlled by the measurement block. At various times, the LI measurement control block looks at what the automatic power control loop is seeing. When small test currents are introduced into the system, it is expected that a small change in the average power will result. The laser measurement control block also has a control signal that is provided to the modulation current source.

In accordance with different embodiments of the invention, the system may couple either or both of the modulation current monitor signal 96 and the bias current monitor signal 84 to gain units 100 ($G_1$) and 102 ($G_2$) via switches 104 and 106 as shown. The outputs of the gain units 100 and 102 are provided to a summing unit 108 that combines with the OMA/ER set point signal 88 to provide a modified set point signal to the laser LI measurement and control unit 86. The gain units 100 and 102 may be either positive or negative in various applications, and the value may be zero to any desired gain value. The switches are shown for illustrative purposes only, and may be avoided for example, by providing either a gain of zero, or simply no feedback from one of the two monitor signals (IMMOM and IBMON).

The signal into the laser LI measurement and control unit 86, therefore, may be represented as OMA/ER set point+$G_1$×IMMON+$G_2$×IBMON, where $G_1$ and $G_2$ are independent coefficients that may be either positive or negative, and at least one is non-zero. For example, in accordance with an embodiment, $G_1$ may be −0.001 and $G_2$ may be 3.2. In embodiments in which the IBMON feedback path is not employed (e.g., $G_2$=0), the value of $G_1$ may be negative.

It should be noted that the value of the gain elements may be implemented in a number of ways. A gain can be set by a passive component such as a resistor or a capacitor or a ratio of such devices in a feedback network, referred to as an analog technique. The gain may also be set by a calculation such as might happen in a digital system such as a digital signal processor, microcontroller, or application specific device that runs a program where analog to digital converters may be used to read the analog signals from the laser driver and the feedback network and is implemented in firmware or software; this is referred to as a digital technique.

Figure 4:
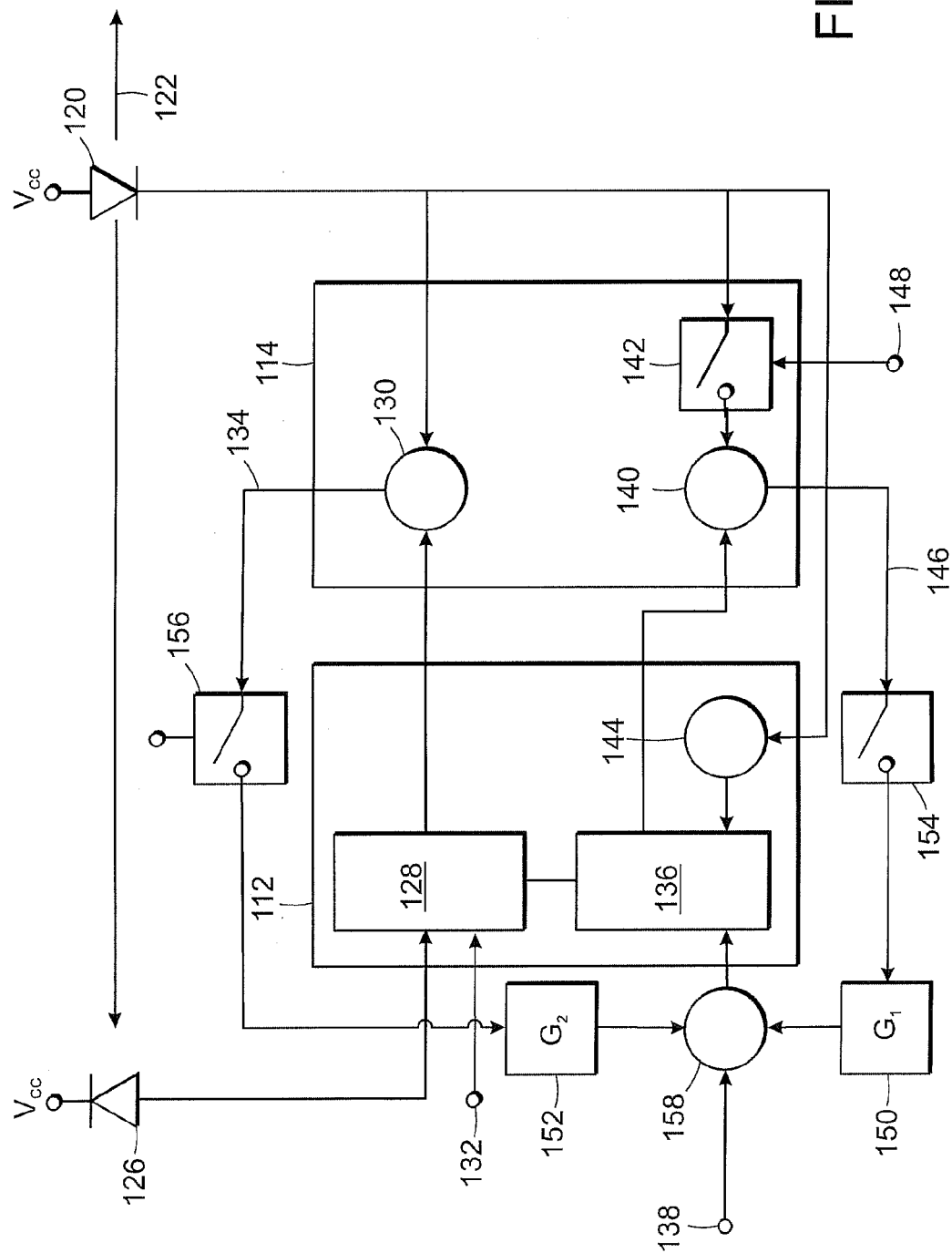
FIG. 4 shows an illustrative diagrammatic view of a laser driver system in accordance with another embodiment of the invention.

While the laser driver of FIG. 3 may be provided with a single integrated circuit chip 110, in accordance with other embodiments, laser drivers in accordance with the invention may be provided using two or more integrated circuit chips 112 and 114 as shown in FIG. 4. Broadly speaking, chip 114 is typically called a laser driver and chip 112 is called a laser control device and might be implemented as a digital signal processor, a microcontroller, or an application specific integrated circuit. Similar to the system of FIG. 3, the system of FIG. 4 includes an output laser diode 120 that provides a laser output signal 122 as well as optical feedback 124 to a back-facet photo monitor diode 126. The photo monitor diode 126 is coupled to Vcc as shown and to an automatic power control loop (APC) 128. The APC 128 measures the current from the diode and compares it to the set point signal 132 (the average power set point). If there is a delta between those points, the APC 128 changes the bias current at the bias current source 130, which changes the draw of current through the laser diode 120. The system also includes a bias current monitor signal 134 that is indicative of the amount of current in the current source 130 as discussed above.

The circuit of FIG. 4 also includes a laser LI measurement and control unit 136 that receives an OMA/ER set point signal 138, and is coupled to a modulation current source 140. The modulation current source 140 is coupled to the laser diode 120 via a data switch 142. The laser LI measurement and control unit also receives an LI measurement test current signal from an LI measurement test current source 144 that is coupled to the laser diode 120, as well as a APC signal from the APC 128. The modulation current source 140 also provides a modulation current monitor signal 146 that is indicative of the level of current in the modulation current source 140. When the data switch 142 is turned on (responsive to a data signal 148), the modulation current source will sink the appropriate amount of current through the diode 120 to product an optical one. These circuits may include either direct connections, or an AC coupled connections where there are capacitors between the laser and the other elements.

Again, the system of FIG. 4 also includes a test current source (the LI measurement test current) that is a small current that is supplied to the laser and is controlled by the measurement block. At various times, the LI measurement control block looks at what the automatic power control loop is seeing. When small test currents are introduced into the system, it is expected that a small change in the average power will result and from this an estimate of the LI of the laser is made. The laser measurement control block also has a control signal that is provided to the modulation current source.

In accordance with different embodiments of the invention, the system may couple either or both of the modulation current monitor signal 146 and the bias current monitor signal 134 to gain units 150 ($G_1$) and 152 ($G_2$) via switches 154 and 156 as shown. The outputs of the gain units 150 and 152 are provided to a summing unit 158 that combines with the OMA/ER set point signal 138 to provide a modified set point signal to the laser LI measurement and control unit 136. The gain units 100 and 102 may be either positive or negative in various applications, and the value may be zero to any desired gain value. The switches are shown for illustrative purposes only, and may be avoided for example, by providing either a gain of zero, or simply no feedback from one of the two monitor signals (IMMON and IBMON).

The signal into the laser LI measurement and control unit 136, therefore, may be represented as OMA/ER set point+$G_1$×IMMON+$G_2$×IBMON, where $G_1$ and $G_2$ are independent coefficients that may be either positive or negative, and at least one is non-zero. For example, in accordance with an embodiment, $G_1$ may be −0.001 and $G_2$ may be 3.2. In embodiments in which the IBMON feedback path is not employed (e.g., $G_2$=0), the value of $G_1$ may be negative.

Figure 5:
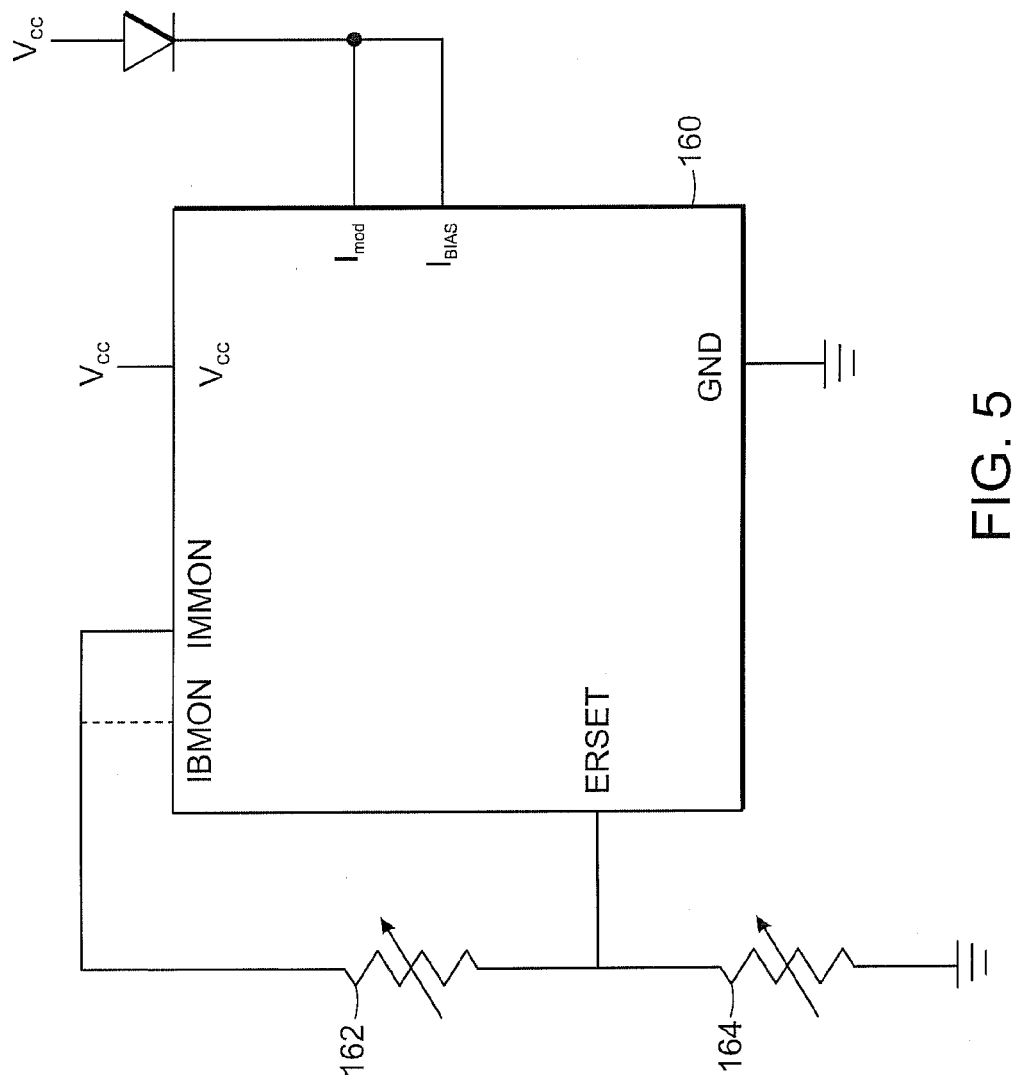
FIGS. 5 and 6 show illustrative schematic views of laser driver systems in accordance with further embodiments of the invention.

A specific implementation of a system in accordance with an embodiment of the invention may involve an ADN2870 laser driver system as sold by Analog Devices of Norwood, Mass. as shown in FIG. 5. The ADN2870 is shown at 160 and includes, in part, Vcc, GND, Ibias, IMMON, IBMON, and ERSET nodes as shown. The feedback control system in accordance with various embodiments of the invention may involve coupling the ERSET node to either the IMMON or IBMON nodes via a first resistor 162 (which may be adjustable), and to ground via a second resistor 164 (which may also be adjustable). In accordance with an embodiment, the resistors 162 and 164 may be chosen to provide a desired gain in the system.

Figure 6:
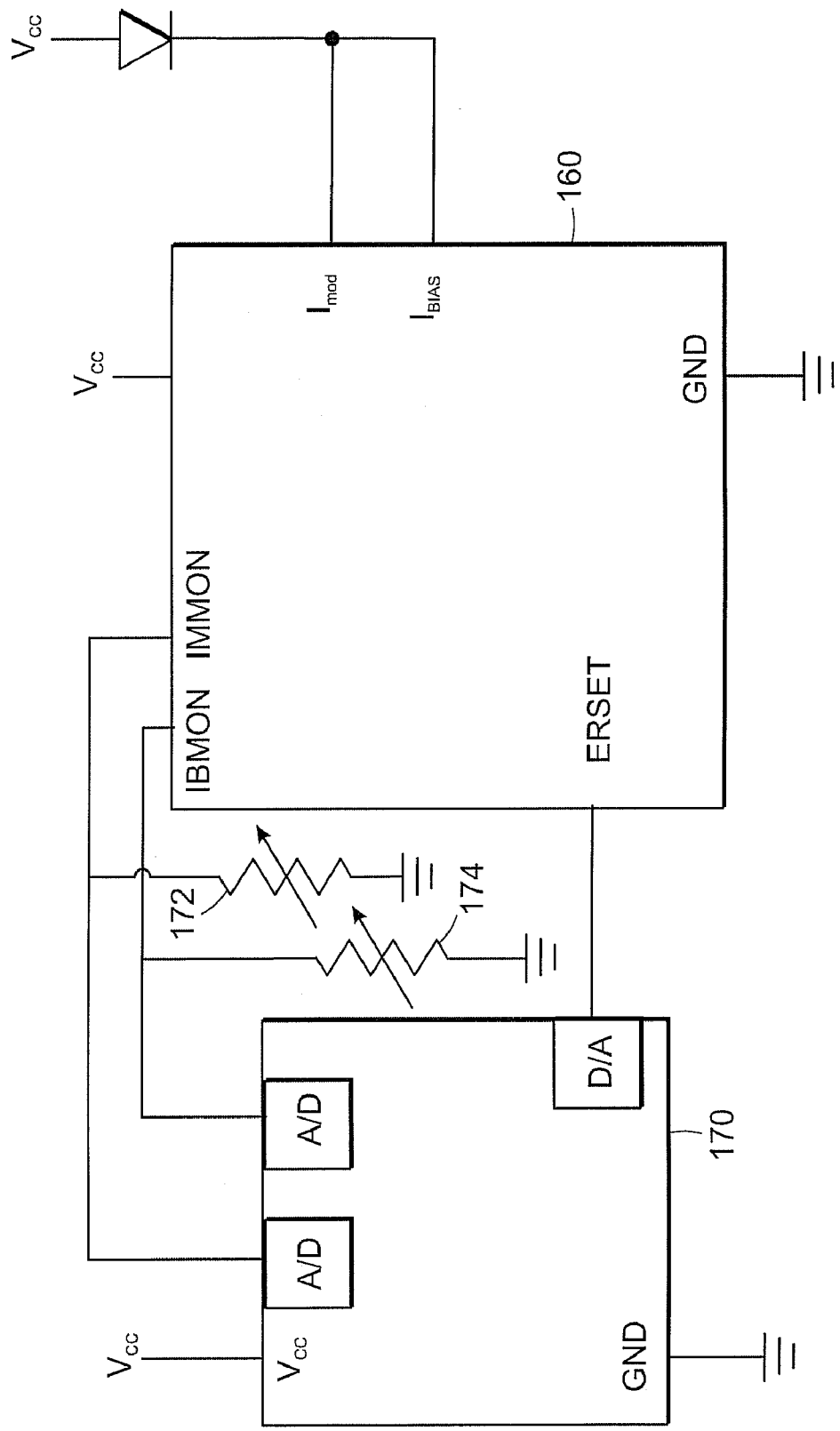

A digital implementation of a control system for the ADN2870 is shown in FIG. 6. In particular, a digital processor controller 170 may be coupled to the IMMON (and/or the IBMON) nodes, and these signals may be converted to digital signals by A/D converters as shown. The controller 170 may coupled to the ERSET node via a D/A converter as shown. The processor 170 may provide the appropriate feedback ratio by multiplying a gain factor by the digital representation of the IMMON or IBMON value and subtracting from the ER/OMA setpoint. The feedback path from either the IMMON or IBMON nodes may also be coupled to ground via a resistor (172 and/or 174 respectively) to provide the desired voltage input signals to the A/D converters on the processor controller 170. The resistors 172 and 174 may also be chosen to provide a desired gain in the system.

Those skilled it the art will appreciate that numerous modifications and variations may be made to the above disclosed embodiments without departing from the spirit and scope of the invention.

What is claimed is:

1. A laser driver system comprising:
   a first monitor current output node for providing a first monitor current output signal that is representative of one of a bias current and a modulation current of the laser driver system;
   a power set node for receiving a power set signal that represents a desired relationship of a power required for the laser driver to produce a high power level threshold to a power required for the laser driver to produce a low power level threshold; and
   a first feedback path extending from the first monitor current output node to the power set node for adjusting the power set signal when the first monitor current output signal becomes non-linear.

2. The laser driver system as claimed in claim 1, where said first monitor current output node is a modulation current monitor node.

3. The laser driver system as claimed in claim 1, where said first monitor current output node is a bias current monitor node.

4. The laser driver system as claimed in claim 1, wherein said power set signal is an extinction ratio signal.

5. The laser driver system as claimed in claim 1, wherein said power set signal is an optical modulation amplitude signal.

6. The laser driver system as claimed in claim 1, wherein said feedback path includes a gain unit having a gain G.

7. The laser driver system as claimed in claim 6, wherein said gain G is negative.

8. The laser driver system as claimed in claim 1, wherein said first feedback path includes a signal processing controller unit.

9. The laser driver system as claimed in claim 1, wherein said first feedback path includes a resistor network.

10. The laser driver system as claimed in claim 9, wherein said resistor network includes at least one adjustable resistor.

11. The laser driver system as claimed in claim 1, wherein said system further includes a second feedback path extending from a second monitor current output node to the power set node for adjusting the power set signal when the second monitor current output signal becomes non-linear.

12. The laser driver system as claimed in claim 11, wherein said second feedback path includes a resistor network.

13. A laser driver system comprising:
   a first monitor current output node for providing a bias current monitor current output signal that is representative of a bias current of the laser driver system;
   a monitor current output node for providing a monitor current output signal that is representative of a monitor current of the laser driver system;
   a power set node for receiving a power set signal that represents a desired relationship of a power required for the laser driver to produce a high power level threshold to a power required for the laser driver to produce a low power level threshold;
   a first feedback path extending from the bias monitor current output node to the power set node for adjusting the power set signal when the bias monitor current output signal becomes non-linear; and
   a second feedback path extending from the current monitor output node to the power set node for adjusting the power set signal when the monitor current output signal becomes non-linear.

14. The laser driver system as claimed in claim 13, wherein said power set signal is an extinction ratio signal.

15. The laser driver system as claimed in claim 1, wherein said power set signal is an optical modulation amplitude signal.

16. The laser driver system as claimed in claim 13, wherein said feedback path includes a gain unit having a gain G that provides a negative gain.

17. The laser driver system as claimed in claim 12, wherein at least one of said bias current feedback path and said monitor current feedback path includes a digital signal processing controller unit.

18. The laser driver system as claimed in claim 13, wherein at least one of said bias current feedback path and said monitor current feedback path includes a resistor network.

19. A method of controlling a laser driver system, said method comprising the steps of:
   providing a first monitor current output signal that is representative of one of a bias current and a modulation current of the laser driver system;
   receiving a power set signal that represents a desired relationship of a power required for the laser driver to produce a high power level threshold to a power required for the laser driver to produce a low power level threshold;
   providing a feedback path extending from the first monitor current output node to the power set node; and
   adjusting the power set signal when the first monitor current output signal becomes non-linear responsive to the feedback path.

20. The method as claimed in claim 19, where said first monitor current output signal is provided at a modulation current monitor node.

21. The method as claimed in claim 19, where said first monitor current output signal is provided at a bias current monitor node.

22. The method as claimed in claim 19, wherein said power set signal is an extinction ratio signal.

23. The method as claimed in claim 18, wherein said power set signal is an optical modulation amplitude signal.

24. The method as claimed in claim 19, wherein said feedback path includes a gain unit having a gain G.

25. The method as claimed in claim 24, wherein said gain G is negative.

26. The method as claimed in claim 18, wherein said first feedback path includes a signal processing controller unit.

27. The method as claimed in claim 19, wherein said first feedback path includes a resistor network.

28. The method as claimed in claim 27, wherein said resistor network includes at least one adjustable resistor.

29. The method as claimed in claim 19, wherein said method further includes the step of providing a second feedback path extending from a second monitor current output node to the power set node for adjusting the power set signal when the second monitor current output signal becomes non-linear.

30. The method as claimed in claim 29, wherein said second feedback path includes a resistor network.

* * * * *